United States Patent
Shimoi et al.

(10) Patent No.: US 9,108,269 B2
(45) Date of Patent: Aug. 18, 2015

(54) METHOD FOR MANUFACTURING LIGHT-ABSORBING SUBSTRATE AND METHOD FOR MANUFACTURING MOLD FOR MAKING SAME

(75) Inventors: Hideki Shimoi, Hamamatsu (JP); Keisuke Araki, Hamamatsu (JP)

(73) Assignee: HAMAMATSU PHOTONICS K. K., Hamamatsu-shi, Shizuoka (JP)

( * ) Notice: Subject to any disclaimer, the term of this patent is extended or adjusted under 35 U.S.C. 154(b) by 19 days.

(21) Appl. No.: 13/388,595

(22) PCT Filed: Jul. 19, 2011

(86) PCT No.: PCT/JP2011/066358
§ 371 (c)(1),
(2), (4) Date: Feb. 2, 2012

(87) PCT Pub. No.: WO2012/014723
PCT Pub. Date: Feb. 2, 2012

(65) Prior Publication Data
US 2012/0125887 A1    May 24, 2012

(30) Foreign Application Priority Data
Jul. 26, 2010  (JP) .................. 2010-167443

(51) Int. Cl.
*B44C 1/22* (2006.01)
*B23K 26/00* (2014.01)
*B23K 26/36* (2014.01)
*H01L 31/0236* (2006.01)

(52) U.S. Cl.
CPC ........... *B23K 26/0084* (2013.01); *B23K 26/365* (2013.01); *H01L 31/02363* (2013.01); *Y02E 10/50* (2013.01)

(58) Field of Classification Search
None
See application file for complete search history.

(56) References Cited

U.S. PATENT DOCUMENTS

| 4,325,182 | A | * | 4/1982 | Tefft et al. .................... 438/465 |
| 4,626,613 | A | * | 12/1986 | Wenham et al. ............... 136/255 |
| 5,080,725 | A | * | 1/1992 | Green et al. .................... 136/256 |
| 5,081,049 | A | * | 1/1992 | Green et al. .................... 438/71 |
| 5,164,324 | A | * | 11/1992 | Russell et al. ................. 438/708 |
| 5,322,988 | A | * | 6/1994 | Russell et al. ............ 219/121.69 |

(Continued)

FOREIGN PATENT DOCUMENTS

| CN | 1251210 | 4/2000 |
| CN | 1831205 | 9/2006 |

(Continued)

OTHER PUBLICATIONS

M. Watanabe, et al., "Femtosecond laser-assisted three-dimensional microfabrication in silica", Mar. 1, 2001, Optics Letters, vol. 26, No. 5, p. 277-279.

*Primary Examiner* — Allan Olsen
(74) *Attorney, Agent, or Firm* — Drinker Biddle & Reath LLP

(57) ABSTRACT

A method for manufacturing a light-absorbing substrate having a surface with depressions and projections comprises a first step of irradiating a substrate with a laser light so as to form a plurality of modified regions arranged two-dimensionally along a surface of the substrate within the substrate and cause at least one of each modified region and a fracture generated from the modified region to reach the surface of the substrate and a second step of etching the surface of the substrate after the first step so as to form depressions and projections on the surface of the substrate.

11 Claims, 13 Drawing Sheets

(56) References Cited

U.S. PATENT DOCUMENTS

| | | | |
|---|---|---|---|
| 6,162,658 A * | 12/2000 | Green et al. | 438/57 |
| 6,645,833 B2 | 11/2003 | Brendel | |
| 6,992,026 B2 | 1/2006 | Fukuyo et al. | |
| 7,033,519 B2 | 4/2006 | Taylor et al. | |
| 7,057,256 B2 * | 6/2006 | Carey et al. | 257/463 |
| 7,354,792 B2 * | 4/2008 | Carey et al. | 438/95 |
| 7,442,629 B2 * | 10/2008 | Mazur et al. | 438/487 |
| 7,943,416 B2 | 5/2011 | Scherff et al. | |
| 8,053,665 B2 * | 11/2011 | Moslehi et al. | 136/252 |
| 8,071,408 B2 * | 12/2011 | Tanaka et al. | 438/38 |
| 8,307,672 B2 * | 11/2012 | Hidaka et al. | 65/31 |
| 8,703,517 B2 * | 4/2014 | Taya et al. | 438/53 |
| 2003/0007772 A1 * | 1/2003 | Borrelli et al. | 385/137 |
| 2003/0017712 A1 | 1/2003 | Brendel | |
| 2003/0235385 A1 * | 12/2003 | Taylor et al. | 385/129 |
| 2005/0272223 A1 | 12/2005 | Fujii et al. | |
| 2006/0180472 A1 * | 8/2006 | Haba et al. | 205/118 |
| 2006/0219676 A1 * | 10/2006 | Taylor et al. | 219/121.69 |
| 2008/0135975 A1 | 6/2008 | Haraguchi et al. | |
| 2008/0289958 A1 * | 11/2008 | Kardokus et al. | 204/298.12 |
| 2009/0137101 A1 * | 5/2009 | Yamazaki et al. | 438/479 |
| 2009/0291261 A1 * | 11/2009 | Hidaka et al. | 428/156 |
| 2009/0317934 A1 | 12/2009 | Scherff et al. | |
| 2010/0050692 A1 * | 3/2010 | Logunov et al. | 65/31 |
| 2010/0117115 A1 * | 5/2010 | Tanaka et al. | 257/103 |
| 2010/0136766 A1 | 6/2010 | Sakamoto et al. | |
| 2010/0300518 A1 * | 12/2010 | Moslehi et al. | 136/255 |
| 2011/0051251 A1 * | 3/2011 | Endoh et al. | 359/614 |
| 2011/0168226 A1 * | 7/2011 | Kim et al. | 136/244 |
| 2011/0303270 A1 * | 12/2011 | Chang et al. | 136/255 |
| 2012/0015470 A1 * | 1/2012 | Nishimura et al. | 438/71 |
| 2012/0037591 A1 * | 2/2012 | Tringe et al. | 216/2 |
| 2012/0103679 A1 * | 5/2012 | Yamamoto et al. | 174/264 |
| 2012/0107994 A1 * | 5/2012 | Taya et al. | 438/53 |
| 2012/0111396 A1 * | 5/2012 | Saylor et al. | 136/255 |
| 2012/0205148 A1 * | 8/2012 | Yamamoto et al. | 174/260 |
| 2012/0261177 A1 * | 10/2012 | Yamamoto et al. | 174/262 |
| 2012/0308765 A1 * | 12/2012 | Nukaga et al. | 428/98 |
| 2013/0001553 A1 * | 1/2013 | Vineis et al. | 257/49 |
| 2013/0029092 A1 * | 1/2013 | Wakioka | 428/131 |
| 2013/0029093 A1 * | 1/2013 | Wakioka | 428/131 |
| 2013/0143381 A1 * | 6/2013 | Kikukawa | 438/381 |

FOREIGN PATENT DOCUMENTS

| | | |
|---|---|---|
| JP | 59-127878 | 7/1984 |
| JP | 63-317270 | 12/1988 |
| JP | 4-150212 | 5/1992 |
| JP | 4-339586 | 11/1992 |
| JP | 2873937 | 1/1999 |
| JP | 2001-15786 | 1/2001 |
| JP | 2001-223370 | 8/2001 |
| JP | 2002-511981 | 4/2002 |
| JP | 2002-210730 | 7/2002 |
| JP | 2003-258285 | 9/2003 |
| JP | 2004-47776 | 2/2004 |
| JP | 2004-128445 | 4/2004 |
| JP | 2004-136358 | 5/2004 |
| JP | 2004-160618 | 6/2004 |
| JP | 2004-223586 | 8/2004 |
| JP | 2004-304130 | 10/2004 |
| JP | 2004-351494 | 12/2004 |
| JP | 2004-359475 | 12/2004 |
| JP | 2005-74663 | 3/2005 |
| JP | 2005-121915 | 5/2005 |
| JP | 2005-121916 | 5/2005 |
| JP | 2005-144586 | 6/2005 |
| JP | 2005-144622 | 6/2005 |
| JP | 2005-152693 | 6/2005 |
| JP | 2005-206401 | 8/2005 |
| JP | 2005-208175 | 8/2005 |
| JP | 2005-306702 | 11/2005 |
| JP | 2005-351774 | 12/2005 |
| JP | 2006-176355 | 7/2006 |
| JP | 2006-290630 | 10/2006 |
| JP | 2007-36758 | 2/2007 |
| JP | 2007-101833 | 4/2007 |
| JP | 2008-147412 | 6/2008 |
| JP | 2010-503222 | 1/2010 |
| WO | 98/43304 | 10/1998 |
| WO | 2009/016776 | 2/2009 |

* cited by examiner

*Fig.11*
(a)
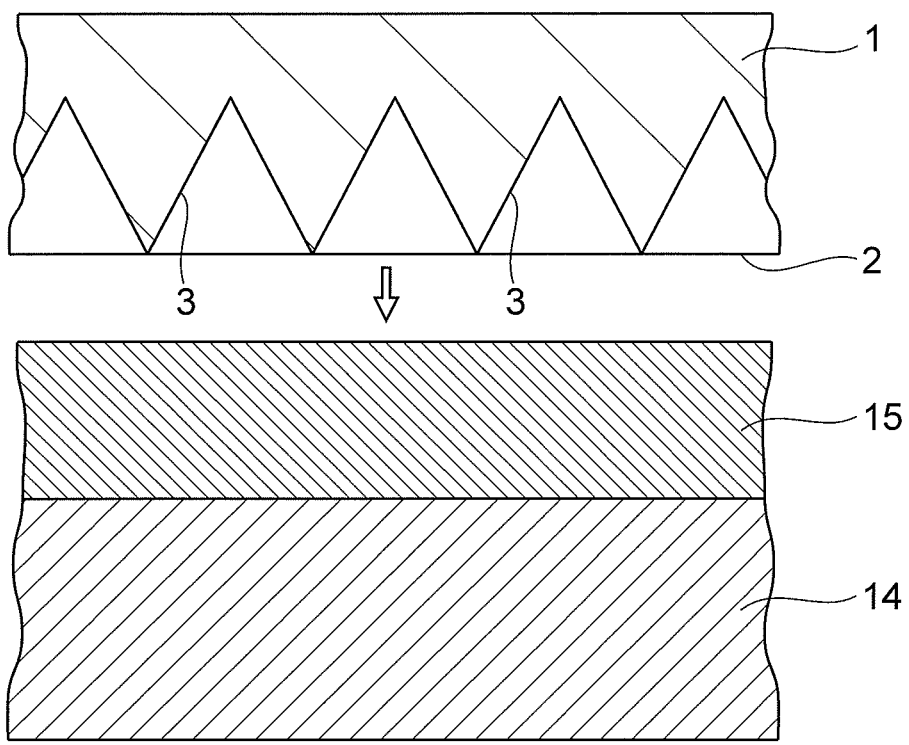
(b)
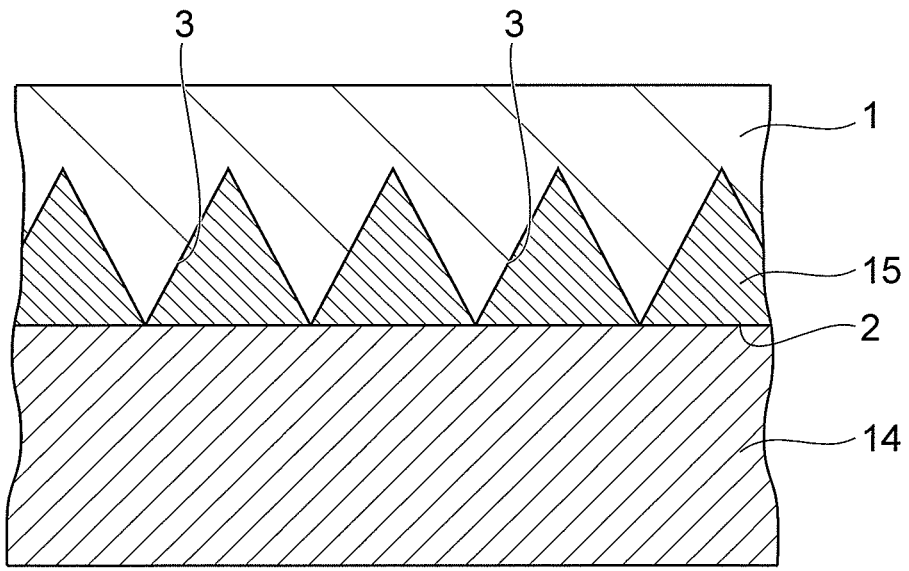

Fig.12
(a)
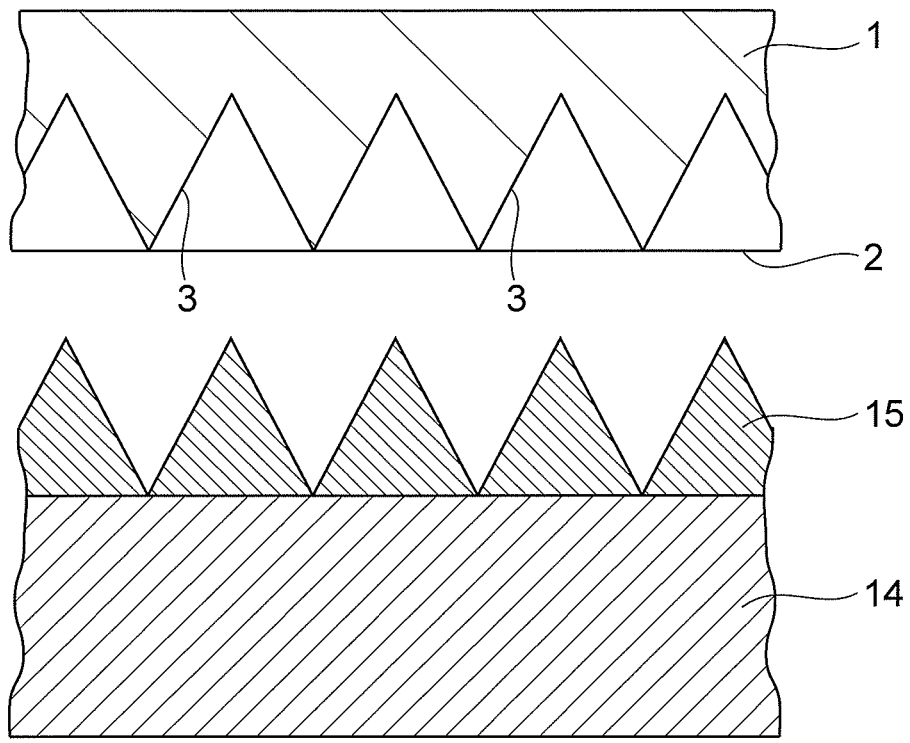
(b)
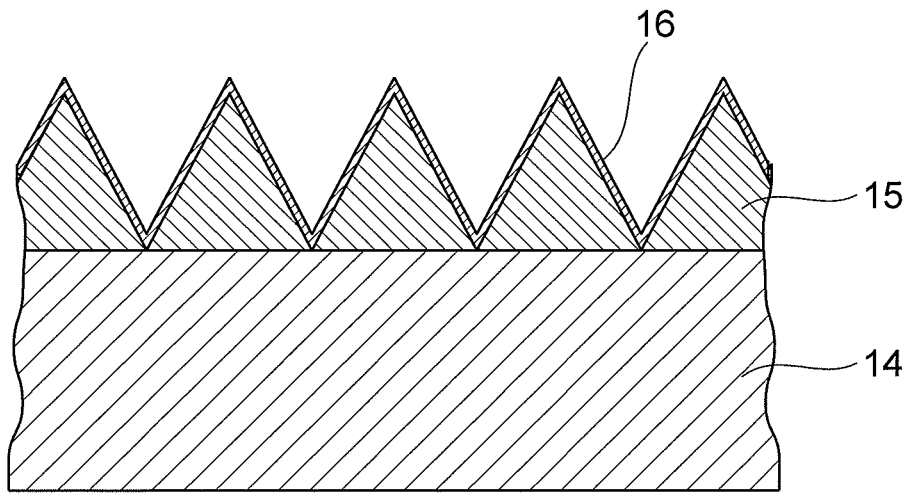

METHOD FOR MANUFACTURING LIGHT-ABSORBING SUBSTRATE AND METHOD FOR MANUFACTURING MOLD FOR MAKING SAME

TECHNICAL FIELD

The present invention relates to a method for manufacturing a light-absorbing substrate employed for a solar battery or the like, for example, and a method for manufacturing a mold for making the same.

BACKGROUND ART

Known as a method for manufacturing a light-absorbing substrate in the above-mentioned technical field is one which, for making depressions and projections on a surface of a substrate, forms a masking pattern on the surface of the substrate and etches the surface of the substrate while using the masking pattern as a mask (see, for example, Patent Literature 1).

CITATION LIST

Patent Literature

Patent Literature 1: Japanese Patent Application Laid-Open No. 2001-223370

SUMMARY OF INVENTION

Technical Problem

However, methods for manufacturing a light-absorbing substrate such as the one mentioned above require time and effort to form the masking pattern, though they can control positions and forms of the depressions.

It is therefore an object of the present invention to provide a method for manufacturing a light-absorbing substrate which can easily manufacture a light-absorbing substrate having a surface with depressions and projections formed in a desirable pattern, and a mold for making the same.

Solution to Problem

The method for manufacturing a light-absorbing substrate in accordance with one aspect of the present invention is a method for manufacturing a light-absorbing substrate having a surface with depressions and projections, the method comprising a first step of irradiating a substrate with a laser light so as to form a plurality of modified regions arranged two-dimensionally along a surface of the substrate within the substrate and cause at least one of each modified region and a fracture generated from the modified region to reach the surface of the substrate, and a second step of etching the surface of the substrate after the first step so as to form depressions and projections on the surface of the substrate.

In this method for manufacturing a light-absorbing substrate, since at least one of each modified region and a fracture generated from the modified region has reached the surface of the substrate, etching selectively advances from each of the modified regions, so as to form a plurality of depressions on the surface of the substrate. Here, positions of the modified regions, i.e., positions of the depressions, can be controlled by irradiation conditions of the laser light. Forms of the depressions can be controlled by etching conditions. Therefore, this method for manufacturing a light-absorbing substrate can easily manufacture a light-absorbing substrate having a surface with depressions and projections formed in a desirable pattern.

In the second step, anisotropic etching may be performed as the etching. This can inhibit a plurality of depressions produced on the surface of the substrate from fluctuating their forms among them.

In the second step, isotropic etching may be performed as the etching after the anisotropic etching. This can smoothen the inner faces of a plurality of depressions formed on the surface of the substrate.

In the first step, the laser light may be relatively moved along the surface of the substrate so as to follow a direction of polarization of the laser light. This can further inhibit the plurality of depressions produced on the surface of the substrate from fluctuating their forms among them.

In the first step, the substrate may be irradiated with the laser light a plurality of times while changing the distance between the surface of the substrate and a converging point of the laser light so as to form the respective modified regions. This can form the depressions such that the ratio of depth to opening width (aspect ratio) of the depressions becomes greater.

The method for manufacturing a mold in accordance with one aspect of the present invention is a method for manufacturing a mold for making a light-absorbing substrate having a surface with depressions and projections, the method comprising a first step of irradiating a substrate with a laser light so as to form a plurality of modified regions arranged two-dimensionally along a surface of the substrate within the substrate and cause at least one of each modified region and a fracture generated from the modified region to reach the surface of the substrate, a second step of etching the surface of the substrate after the first step so as to form depressions and projections on the surface of the substrate, and a third step of transferring a form of the surface of the substrate after the second step so as to yield the mold.

In this method for manufacturing a mold, since at least one of each modified region and a fracture generated from the modified region has reached the surface of the substrate, etching selectively advances from each of the modified regions, so as to form a plurality of depressions on the surface of the substrate. Here, positions of the modified regions, i.e., positions of the depressions, can be controlled by irradiation conditions of the laser light. Forms of the depressions can be controlled by etching conditions. Since a surface form of the substrate in which positions and forms of the depressions are thus controlled is transferred, a mold formed with depressions and projections complementary to those formed on the surface of the substrate is obtained. Therefore, this method for manufacturing a mold can manufacture a mold which can make a light-absorbing substrate having a surface with depressions and projections formed in a desirable pattern.

Advantageous Effects of Invention

The present invention can provide a method for manufacturing a light-absorbing substrate which can easily manufacture a light-absorbing substrate having a surface with depressions, and projections in a desirable pattern and a mold for making the same.

BRIEF DESCRIPTION OF DRAWINGS

[FIG. 11] is a perspective view illustrating a third step in the method for manufacturing a mold in accordance with the embodiment of the present invention;

[FIG. 12] is a sectional view illustrating the third step in the method for manufacturing a mold in accordance with the embodiment of the present invention; and

DESCRIPTION OF EMBODIMENTS

Figure 1:
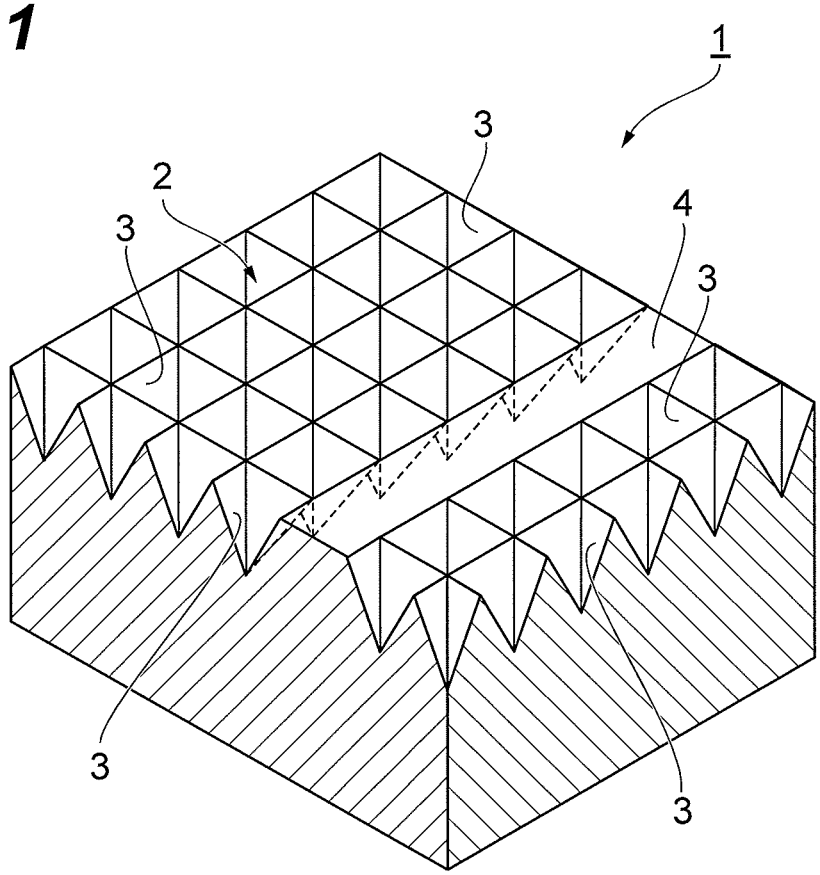
[FIG. 1] is a perspective view of a light-absorbing substrate manufactured by the method for manufacturing a light-absorbing substrate in accordance with an embodiment of the present invention.

In the following, preferred embodiments of the present invention will be explained in detail with reference to the drawings. In the drawings, the same or equivalent parts will be referred to with the same signs while omitting their overlapping descriptions.

[Method for Manufacturing a Light-Absorbing Substrate]

As illustrated in FIG. 1, a light-absorbing substrate 1 has a surface 2 with depressions and projections (having an average difference in height of about 10 μm). The light-absorbing substrate 1, which is employed in a solar battery, is constituted by a rectangular sheet-like monocrystal silicon substrate whose surface 2 is a (100) plane. The surface 2 is a so-called nonreflective surface and serves as a surface for receiving sunlight. The surface 2 is formed with a plurality of depressions 3 arranged in a two-dimensional matrix and a flat part 4. Each depression 3 is formed into a quadrangular pyramid which becomes wider toward the outside (toward the opening). The flat part 4 is a part where wiring electrodes for the solar battery and the like are formed.

Figure 2:
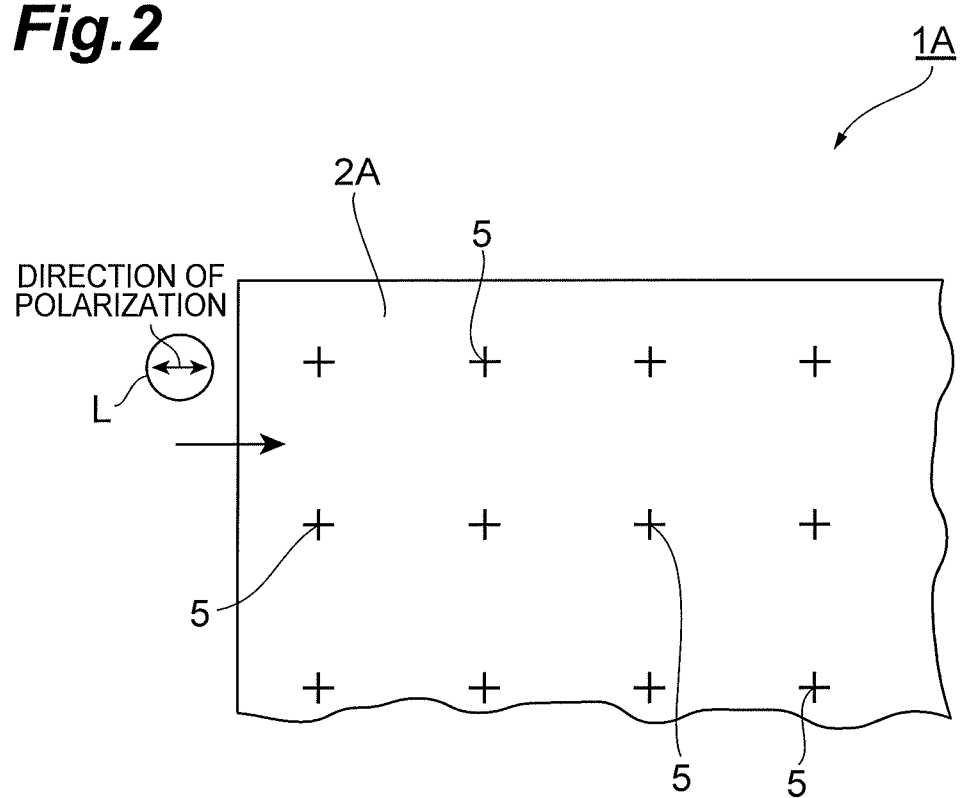
[FIG. 2] is a plan view illustrating a first step in the method for manufacturing a light-absorbing substrate in accordance with the embodiment of the present invention.
Figure 3:
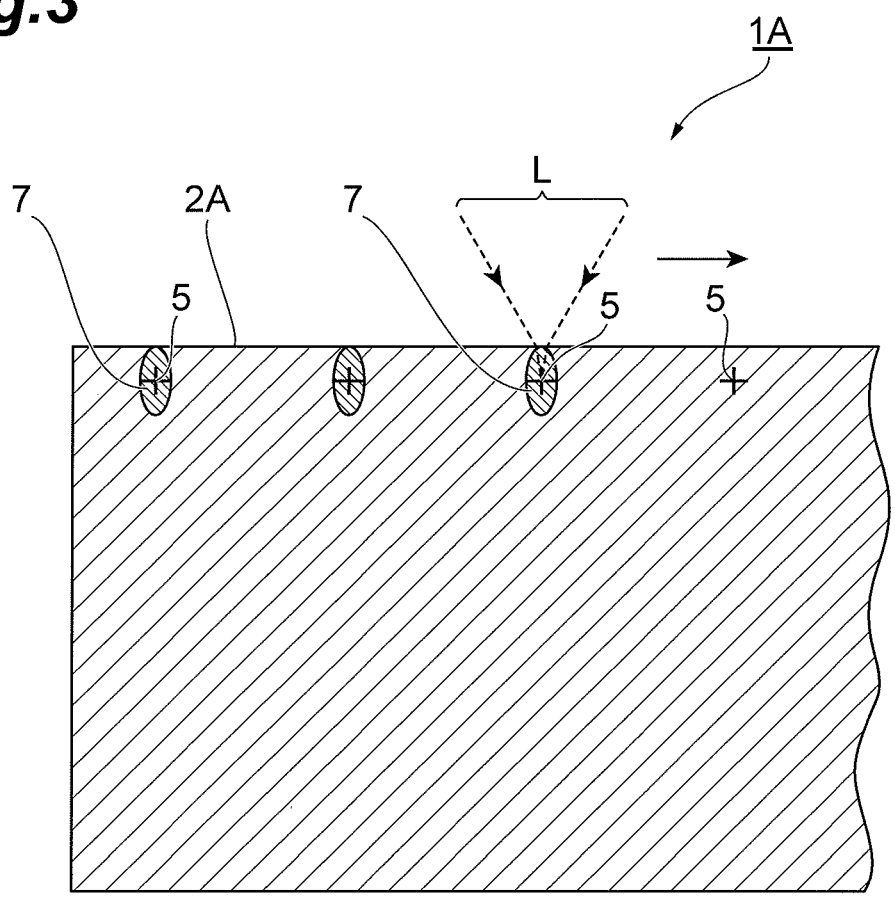
[FIG. 3] is a sectional view illustrating the first step in the method for manufacturing a light-absorbing substrate in accordance with the embodiment of the present invention.

A method for manufacturing thus constructed light-absorbing substrate 1 will now be explained. First, as illustrated in FIGS. 2 and 3, a substrate 1A which is a base material for the light-absorbing substrate 1 is prepared. The substrate 1A is made of a rectangular sheet-like monocrystal substrate whose surface 2A is a (100) plane. Subsequently, scheduled formation positions 5 for modified regions 7 are set in the substrate 1A such as to correspond to the respective center positions of the depressions 3 of the light-absorbing substrate 1 as seen in its thickness direction. Each scheduled formation position 5 is set within the substrate 1A at a predetermined distance from the surface 2A such that at least one of each modified region 7 and a fracture generated from the modified region 7 reaches the surface 2A. The interval between the adjacent scheduled formation positions 5 is about 10 μm.

Next, the substrate 1A is irradiated with a laser light L while locating a converging point P at each scheduled formation position 5. This forms a plurality of modified regions 7 arranged in a two-dimensional matrix along the surface 2A within the substrate 1A and causes at least one of each modified region 7 and a fracture generated from the modified region 7 to reach the surface 2A.

Here, when forming the modified regions 7, the substrate 1A is irradiated with the pulsed laser light L having a wavelength of 1064 nm under conditions with a peak power density of $1 \times 10^8$ W/cm$^2$ or more at the converging point P and a pulse width of 1 μs or less while using the surface 2A of the substrate 1 as a laser light entrance surface and locating the converging point within the substrate 1A. As a consequence, the laser light L is transmitted through the surface 2A of the substrate 1A and absorbed in particular in the vicinity of the scheduled formation positions 5 (i.e., positions of the converging point P where the laser light L is converged) within the substrate 1A, whereby the modified regions 7 are formed within the substrate 1A. Thus, the internal absorption type laser processing forming the modified regions 7 within the substrate 1A is much different from surface absorption type laser processing which melts or evaporates a part of the substrate 1A on the surface 2A so as to form depressions, grooves, and the like on the surface 2A.

The modified regions 7 are regions whose physical characteristics such as density, refractive index, and mechanical strength have attained states different from those of their surroundings. Examples of the modified regions 7 include molten processed regions, crack regions, dielectric breakdown regions, refractive index changed regions, and their mixed regions according to the material of the substrate 1A. Further examples of the modified regions 7 include, according to the material of the substrate 1A, an area whose density has changed from that of an unmodified region in a material of a workpiece and an area formed with a lattice defect (which may collectively be referred to as a high-density transitional region).

The molten processed regions, refractive index changed regions, areas where the modified region 7 has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region 7 or in only a part or a plurality of parts thereof. Molten processed regions are mainly formed as the modified regions 7 here, since monocrystal silicon is employed as a material for the substrate 1A, though various materials can be selected without being restricted to monocrystal silicon.

During the irradiation, the laser light L is relatively moved along the surface 2A of the substrate 1A so as to follow the direction of polarization of the laser light L which is a linearly-polarized light. The laser light L is pulse-oscillated in the vicinity of each scheduled formation position 5 so as to yield a peak power density at a processing threshold or higher, but continuously oscillated in the remaining parts. This forms the modified region at each scheduled formation position 5 and causes at least one of each modified region 7 and a fracture generated from the modified region to reach the surface 2A. Each modified region 7 includes at least one modified spot (a modified part formed by irradiation with one pulse of the pulsed laser light L). When one modified region 7 includes a plurality of modified spots, the plurality of modified spots may be formed either continuously or intermittently, though it will be preferred if at least fractures join with each other between the plurality of modified spots.

Figure 4:
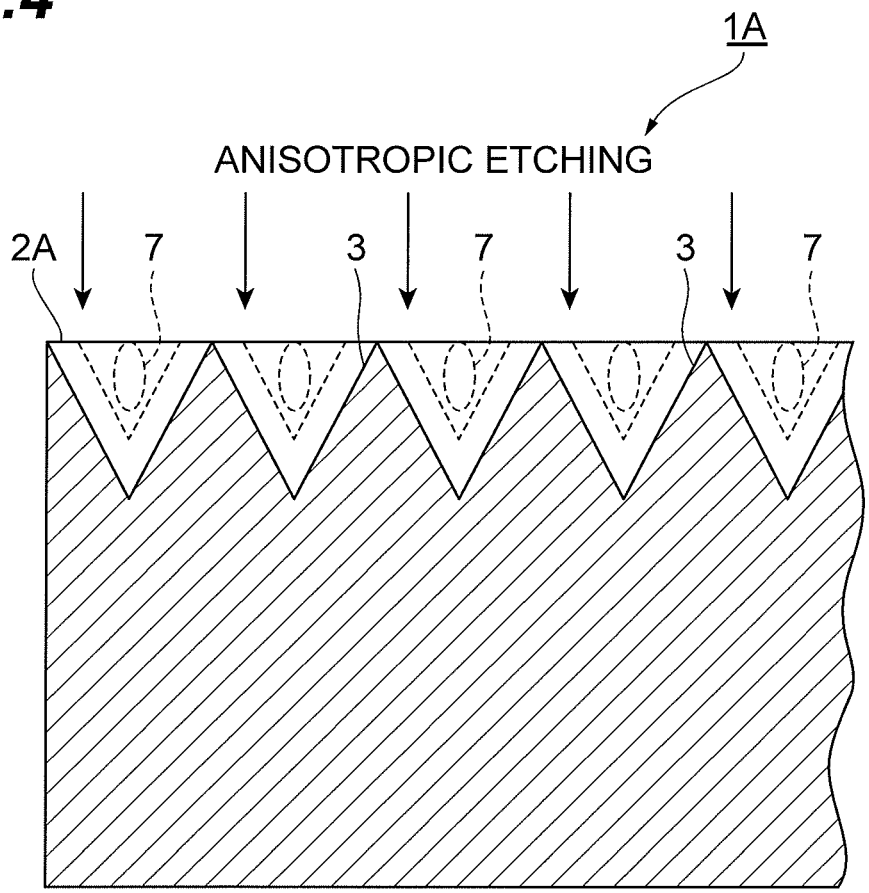
[FIG. 4] is a sectional view illustrating a second step in the method for manufacturing a light-absorbing substrate in accordance with the embodiment of the present invention.
Figure 5:
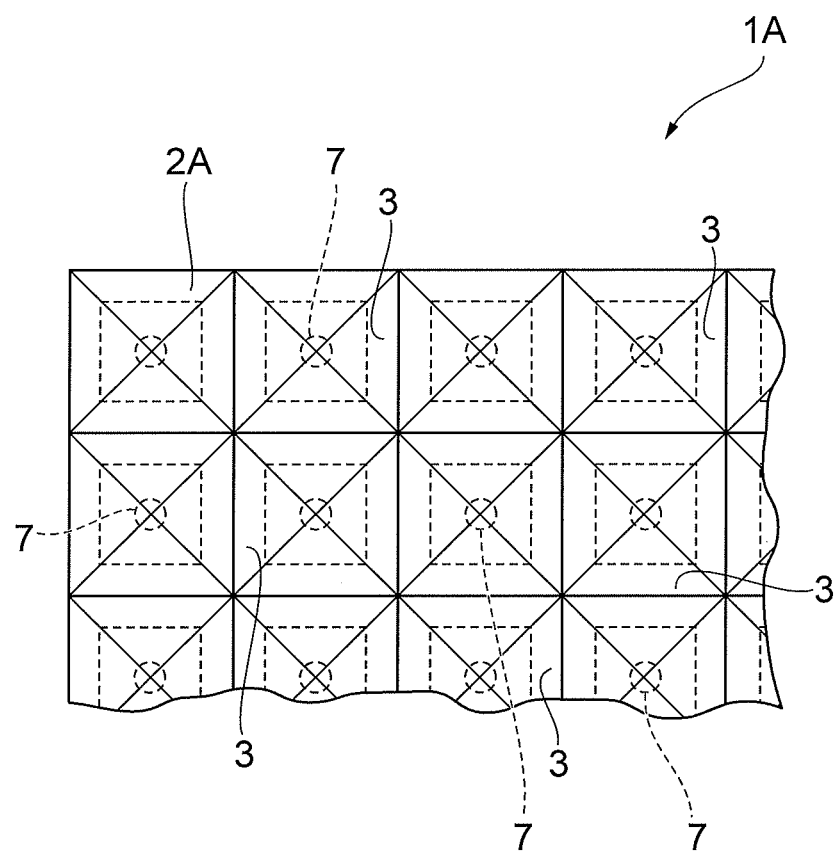
[FIG. 5] is a plan view illustrating the second step in the method for manufacturing a light-absorbing substrate in accordance with the embodiment of the present invention.

After forming the modified regions 7, the surface 2A of the substrate 1A is etched as illustrated in FIGS. 4 and 5, so as to produce depressions and projections on the surface 2A. Here, KOH (potassium hydroxide), for example, is selected as an etchant, with which anisotropic etching is performed. By this time, at least one of each modified region 7 and a fracture generated from the modified region 7 has reached the surface 2A, so that the etchant enters the modified region 7, whereby the etching selectively progresses from the modified region 7 having a higher etching rate than in its surroundings and acting as a start point. The etching encompasses a case where the substrate 1A is immersed in the etchant (dipping) and a case where the substrate 1A is coated with the etchant while being rotated (spin etching).

The etching is terminated at a stage where the surface 2A has attained a desirable form. This anisotropic etching exposes (111) planes having a lower etching rate, so as to form depressions 3 each shaped like a quadrangular pyramid which becomes wider toward the outside (toward the opening). The foregoing makes the surface 2A of the substrate 1A become the surface 2 of the light-absorbing substrate 1, thereby yielding the light-absorbing substrate 1 having the surface 2 with depressions and projections.

In the method for manufacturing the light-absorbing substrate 1, as explained in the foregoing, at least one of each modified region 7 and a fracture generated from the modified region 7 reaches the surface 2A of the substrate 1A, so that the etching progresses selectively from the modified region 7 acting as a start point, thereby forming a plurality of depressions 3 on the surface 2A of the substrate 1A. Here, positions of the modified regions, i.e., positions of the depressions 3, can be controlled easily and accurately according to irradiation conditions of the laser light L (e.g., positions at which the converging point P is located, the relative moving speed of the laser light L, the repetition frequency of the laser light L, and timings for smiting the processing threshold of the laser light L). Forms of the depressions 3 can be controlled easily and precisely according to etching conditions (e.g., etching time and a temperature at which the etchant is used). Therefore, the method for manufacturing the light-absorbing substrate 1 can easily manufacture the light-absorbing substrate 1 having the surface 2 with depressions and projections formed in a desirable pattern.

During the irradiation, the laser light L is relatively moved along the surface 2A of the substrate 1A so as to follow the direction of polarization of the laser light L. As a consequence, the modified regions 7, fractures generated from the modified regions 7, and thermally influenced regions about the modified regions 7 are stabilized among a plurality of scheduled formation positions 5. This can inhibit a plurality of depressions 3 produced on the surface 2A of the substrate 1A from fluctuating their forms among them.

Anisotropically etching the surface 2A of the substrate 1A as the etching also contributes to inhibiting a plurality of depressions 3 from fluctuating their forms among them. Here, since the substrate 1A is made of a monocrystal silicon substrate and has the surface 2A in a (100) plane, (111) planes are exposed as the etching progresses from the modified regions 7 acting as a start point, whereby a plurality of depressions 3 each shaped like a quadrangular pyramid expanding outward are formed.

Figure 6:
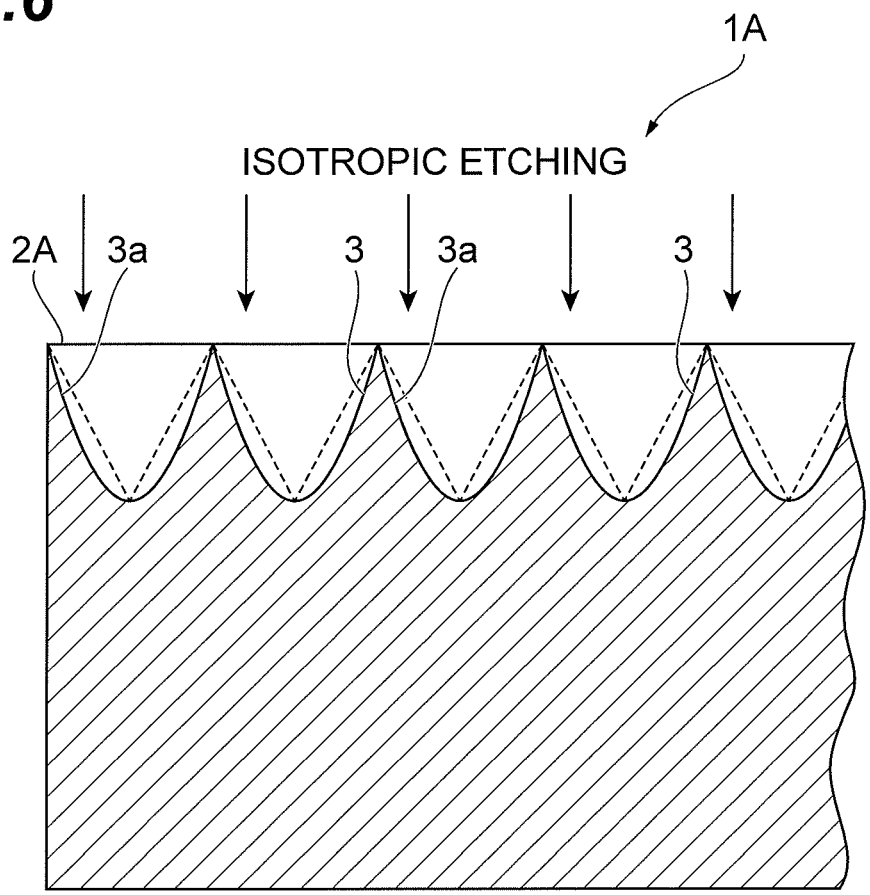
[FIG. 6] is a sectional view illustrating the second step in the method for manufacturing a light-absorbing substrate in accordance with another embodiment of the present invention.

As illustrated in FIG. 6, isotropic etching may further be performed after the anisotropic etching. This can smoothen the inner faces 3a of the plurality of depressions 3 formed on the surface 2A of the substrate 1A. Here, the inner faces 3a of the depressions 3 each shaped like a quadrangular pyramid expanding outward are smoothened, so as to yield the depressions 3 each having a form similar to a Winston cone which is highly effective in gathering light.

Figure 7:
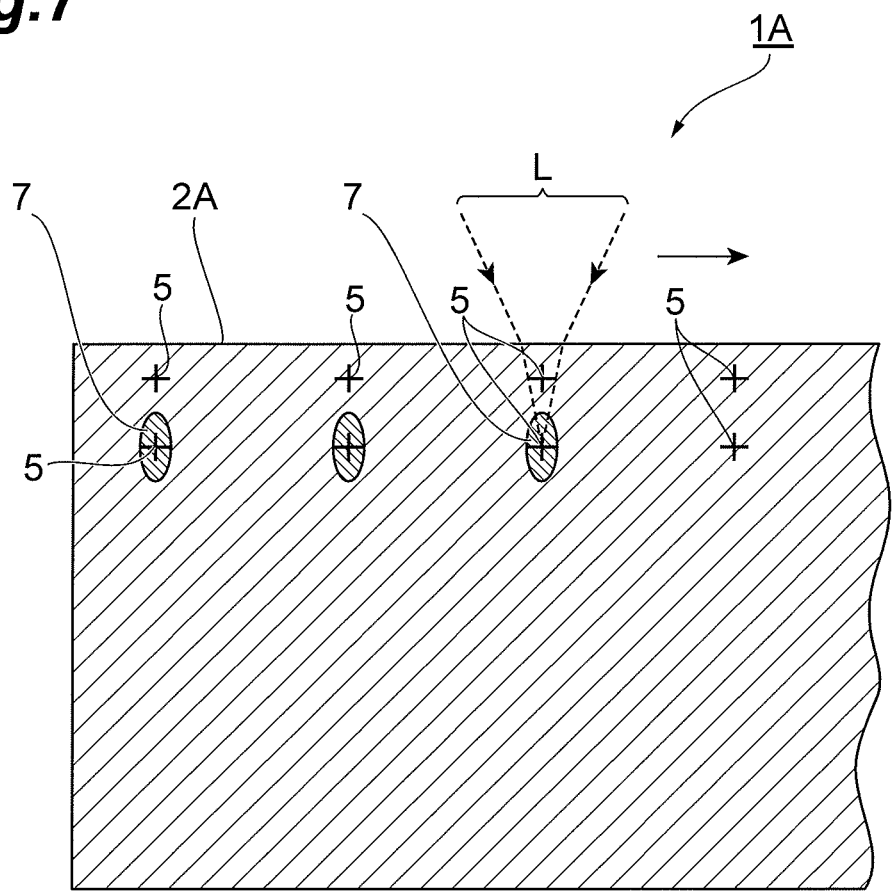
[FIG. 7] is a sectional view illustrating the first step in the method for manufacturing a light-absorbing substrate in accordance with still another embodiment of the present invention.
Figure 8:
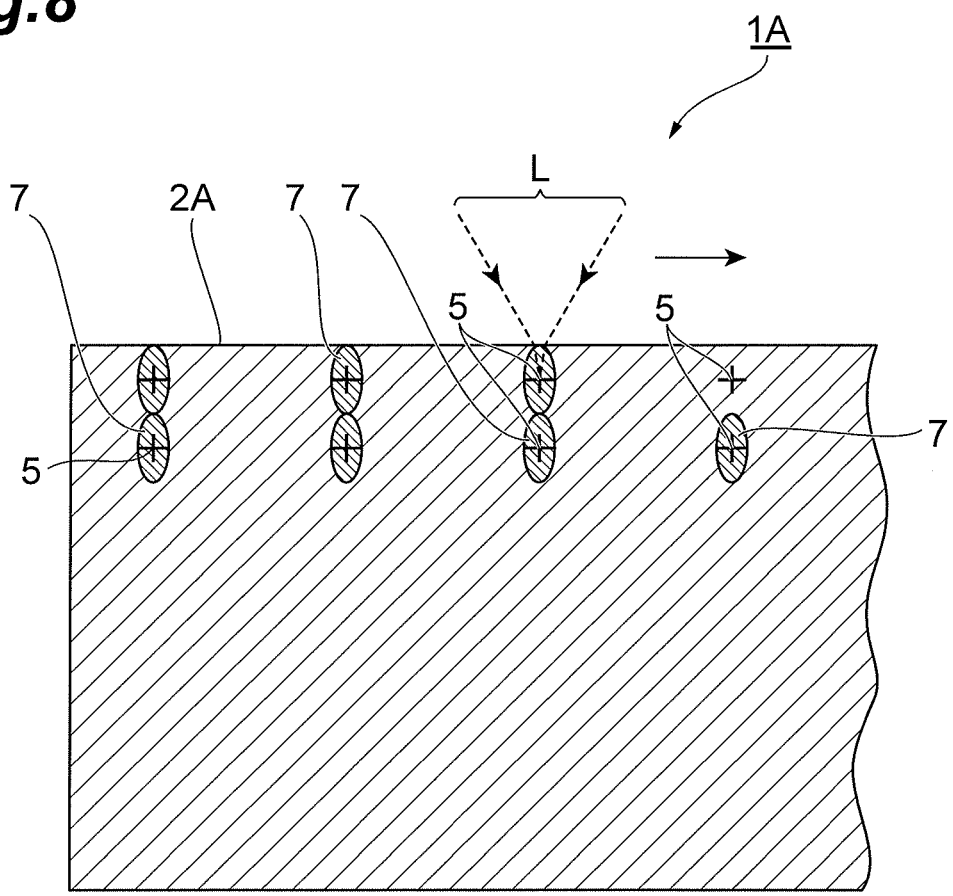
[FIG. 8] is a sectional view illustrating the first step in the method for manufacturing a light-absorbing substrate in accordance with the above-mentioned embodiment of the present invention.
Figure 9:
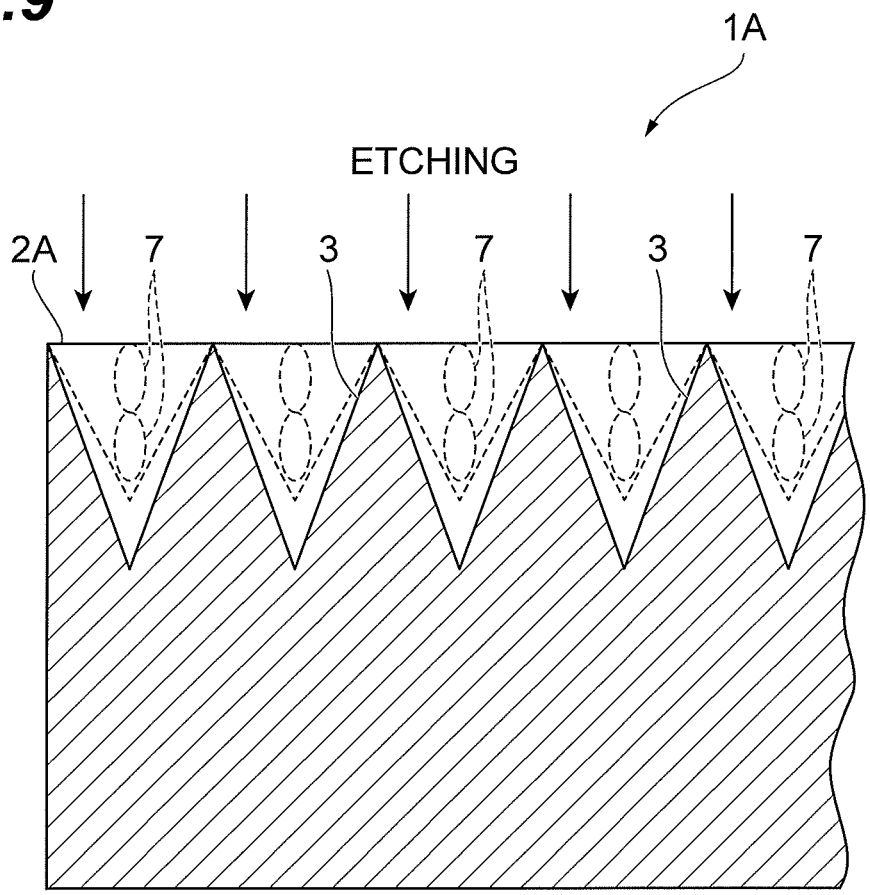
[FIG. 9] is a sectional view illustrating the second step in the method for manufacturing a light-absorbing substrate in accordance with the above-mentioned embodiment of the present invention.

As illustrated in FIGS. 7 and 8, scheduled formation positions 5 may be set at a plurality of positions differently distanced from the surface 2A of the substrate 1A so as to align along the thickness direction of the substrate 1A, and the respective modified regions 7 may be formed at the scheduled formation positions 5. That is, the irradiation with the laser light L may be performed a plurality of times while changing the distance from the surface 2A of the substrate 1A to the converging point P of the laser light L, so as to form the respective modified regions 7. This makes it possible to form a depression 3 whose ratio of the depth to the width of its opening is greater (e.g., having an aspect ratio of 2 or more) by etching as illustrated in FIG. 9. Preferably, in this case, the scheduled formation positions 5 are irradiated with the laser light L in descending order of their distance from the laser light entrance surface. This aims to prevent a modified region 7 from being formed in front of a scheduled formation position 5 in the advancing direction of the laser light L and inhibiting the conversion of the laser light L. Furthermore, by using the elongate converging point P which extends longer in the thickness direction of the substrate 1A (i.e., in the converging point P, the thickness direction of the substrate 1A is the longitudinal direction), a elongate modified region 7 which extends longer in the thickness direction of the substrate 1A may also be formed. In this case, it is possible to reduce the number of times the laser light L is irradiated. The elongate converging point P can be formed, for example, by aligning a plurality of converging points P in the thickness direction of the substrate 1A.

[Method for Manufacturing a Mold]

Figure 10:
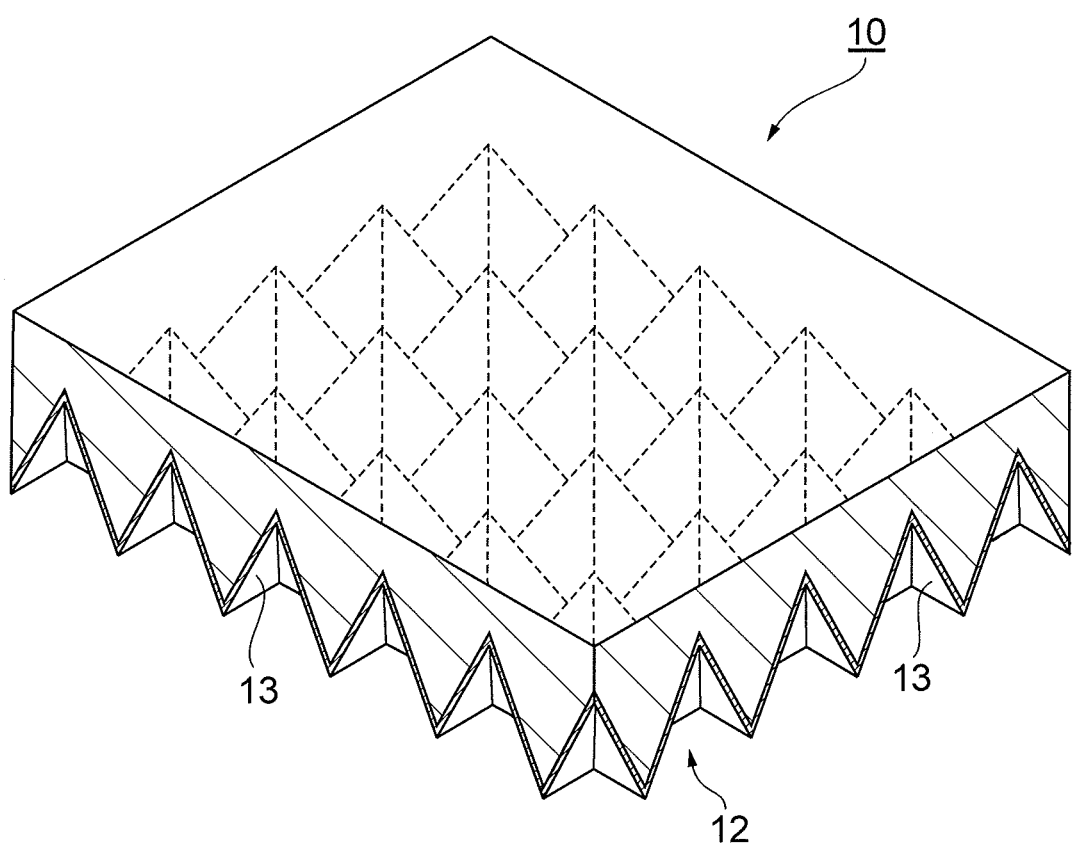
[FIG. 10] is a perspective view of a mold manufactured by the method for manufacturing a mold in accordance with an embodiment of the present invention.

As illustrated in FIG. 10, a mold 10 has a surface 12 with depressions and projections. The mold 10 is a mold for making a light-absorbing substrate having a surface with depressions and projections (corresponding to the above-mentioned light-absorbing substrate 1) by nanoimprinting or the like and is made of a metal such as nickel, for example. The depressions and projections on the surface 12 are complementary to those formed on the surface of the light-absorbing substrate. A plurality of depressions 13 arranged in a two-dimensional matrix are formed on the surface 12. Each depression 13 is formed into a quadrangular pyramid which becomes thinner toward the inside (toward the side opposite to the opening).

A method for manufacturing thus constructed mold 10 will now be explained. First, the above-mentioned light-absorbing substrate 1 is prepared by the manufacturing method explained above as a master for a light-absorbing substrate to be produced by nanoimprinting or the like. Subsequently, as illustrated in FIG. 11(a), a resist layer 15 is mounted on a substrate 14 made of silicon, for example. Then, as illustrated in FIG. 11(b), the surface 2 of the light-absorbing substrate 1 is pressed against the resist layer 15, so as to transfer the form of the surface 2 to the resist layer 15.

Figure 13:
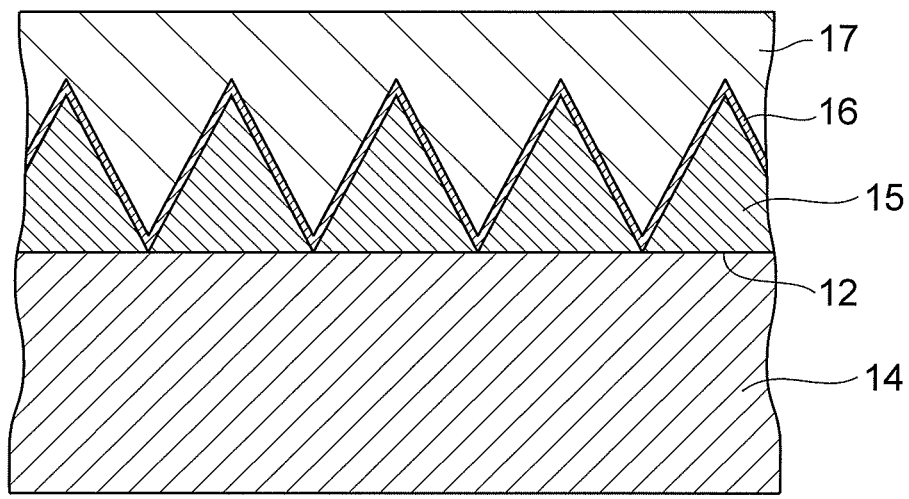
[FIG. 13] is a sectional view illustrating the third step in the method for manufacturing a mold in accordance with the embodiment of the present invention.

Next, as illustrated in FIG. 12(a), the light-absorbing substrate 1 is released from the resist layer 15. Subsequently, as illustrated in FIG. 12(b), a metal such as nickel, for example, is vapor-deposited on the surface of the resist layer 15 formed with depressions and projections complementary to those formed on the surface 2 of the light-absorbing substrate 1, so as to form a metal layer 16. Then, as illustrated in FIG. 13, a metal such as nickel is thickly deposited into a block on the metal layer 16 by electrocasting, so as to form a metal layer 17. Thereafter, the resist layer 15 is melted away (the substrate 14 may also be melted away if necessary), so as to take out the metal layers 16, 17, thereby yielding the mold 10.

As explained in the foregoing, the method for manufacturing the mold 10 prepares the above-mentioned light-absorbing substrate 1 by the above-mentioned manufacturing method as a master for the light-absorbing substrate to be made. In the above-mentioned manufacturing method, at least one of each modified region 7 and a fracture generated from the modified region 7 has reached the surface 2A of the substrate 1A, so that the etching selectively progresses from the modified region 7 acting as a start point, thereby forming a plurality of depressions 3 on the surface 2A of the substrate 1A. Here, positions of the modified regions, i.e., positions of the depressions 3, can be controlled easily and accurately according to irradiation conditions of the laser light L. Forms of the depressions 3 can be controlled easily and precisely according to etching conditions. Since the form of the surface 2 in which the positions and forms of the depressions 3 are thus controlled is transferred, the mold 10 formed with the depressions and projections complementary to those formed on the surface 2 is obtained. Hence, the method for manufacturing the mold 10 can make the mold 10 that can produce a light-absorbing substrate having a surface with depressions and projections formed in a desirable pattern.

Though embodiments of the present invention have been explained in the foregoing, the present invention is not limited to the above-mentioned embodiments. For example, while the above-mentioned embodiments form a plurality of modified regions 7 within the substrate 1A arranged in a two-dimensional matrix along the surface 2A of the substrate 1A, the arrangement of modified regions 7 is not limited to matrix forms. A plurality of modified regions 7 may be formed in a desirable two-dimensional arrangement so as to produce depressions and projections in a desirable pattern.

The laser light L is not limited to the linearly-polarized light. When the laser light L is polarized, the laser light L which is an elliptically-polarized light having an ellipticity other than 1 can be used. Here, the ellipticity of the elliptically-polarized light is (half the length of the minor axis)/(half the length of the major axis) in the ellipse representing the elliptically-polarized light. Therefore, an elliptically-polarized light with an ellipticity of 1 corresponds to a circularly-polarized light, while an elliptically-polarized light with an ellipticity of 0 (zero) corresponds to a linearly-polarized light. The direction of polarization of the laser light is the direction of the major axis of the ellipse representing the elliptically-polarized light. Hence, when the ellipticity is 0, the direction of polarization of the laser light is the direction of a line representing the linearly-polarized light.

When the laser light L which is the elliptically-polarized light having an ellipticity other than 1 is used, it is desirable that the direction of polarization of the laser light L and the direction of relative movement of the laser light L substantially coincide with each other (i.e., be substantially parallel to each other). However, fluctuations of forms among a plurality of depressions 3 can be suppressed more when the angle between the direction of polarization of the laser light L and the direction of relative movement of the laser light L is less than 45° than when the angle is 90°, for example.

Finally, examples of the relationship between the material for the substrate 1A and an etchant used therefor will be explained. When the material for the substrate 1A is Si, a mixed liquid of $HNO_3$ (nitric acid), HF (hydrofluoric acid), and $H_2O$ (water) or $CH_3COOH$ (acetic acid) can be used as an isotropic etchant. When the material for the substrate 1A is Si, KOH (potassium hydroxide), TMAH (aqueous tetramethylammonium hydroxide solution), EDP, NaOH, CsOH, $NH_4OH$, or hydrazine can be used as an anisotropic etchant.

When the material for the substrate 1A is GaAs, a mixed liquid of $H_2SO_4$ (sulfuric acid), $H_2O_2$ (hydrogen peroxide solution), and $H_2O$ (water); a mixed liquid of $H_3PO_4$ (phosphoric acid), $H_2O_2$ (hydrogen peroxide solution), and $H_2O$ (water); $HNO_3$ (nitric acid); HCl (hydrochloric acid); $CH_3OH$ (bromomethane); or a mixed liquid of $NH_4OH$ (ammonium hydroxide), $H_2O_2$ (hydrogen peroxide solution), and $H_2O$ (water) can be used. When the material for the substrate 1A is silica (glass), a mixed liquid of HF (hydrofluoric acid) and $H_2O$ (water); HF, or $NH_4F$ (saturated aqueous solution of ammonium bifluoride) can be used. When the material for the substrate 1A is sapphire, $H_3PO_4$ (phosphoric acid) or $H_2SO_4$ (sulfuric acid)+$H_3PO_4$ (phosphoric acid) can be used. When the material for the substrate 1A is SiC, KOH (potassium hydroxide) can be used. When the material for the substrate 1A is quartz, $NH_4F$ can be used.

Industrial Applicability

The present invention can provide a method for manufacturing a light-absorbing substrate which can easily manufacture a light-absorbing substrate having a surface with depressions and projections formed in a desirable pattern, and a mold for making the same.

Reference Signs List

1 . . . light-absorbing substrate; 1A . . . substrate; 2 . . . surface; 2A . . . surface; 7 . . . modified region; 10 . . . mold; L . . . laser light

The invention claimed is:

1. A method for manufacturing a light-absorbing substrate having a surface with depressions and projections, the method comprising:
   a first step of irradiating a substrate with a laser light so as to form a plurality of modified regions arranged two-dimensionally along a surface of the substrate within the substrate and cause the surface of the substrate to be reached at each modified region by at least one of: (i) a modified region itself reaching the surface, or (ii) a fracture that originates from the modified region reaching the surface;
   in the first step, the substrate is irradiated with the laser light a plurality of times while changing the distance between the surface of the substrate and a converging point of the laser light so as to form, in an area corresponding to a depression, a plurality of the modified regions aligned along a thickness direction of the substrate; and
   a second step of etching the surface of the substrate after the first step so as to form depressions and projections on the surface of the substrate,
   wherein the depressions are each independently formed by etching progressing from the modified region or the fracture as a start point, and
   wherein the plurality of modified regions are formed in matrix form.

2. A method for manufacturing a light-absorbing substrate according to claim 1, wherein, in the second step, anisotropic etching is performed as the etching.

3. A method for manufacturing a light-absorbing substrate according to claim 2, wherein, in the second step, isotropic etching is performed as the etching after the anisotropic etching.

4. A method for manufacturing a light-absorbing substrate according to claim 1, wherein, in the first step, the laser light is relatively moved along the surface of the substrate so as to follow a direction of polarization of the laser light.

5. A method for manufacturing a light-absorbing substrate according to claim 1, wherein the modified regions are arranged in a two-dimensional matrix.

6. A method for manufacturing a light-absorbing substrate according to claim 5, wherein each center position of the plurality of depressions match the formation position of the modified regions that are arranged in a two-dimensional matrix.

7. A method for manufacturing a light-absorbing substrate according to claim 1, wherein the depressions formed by etching expand outward.

8. A method for manufacturing a mold for making a light-absorbing substrate having a surface with depressions and projections, the method comprising:
   a first step of irradiating a substrate with a laser light so as to form a plurality of modified regions arranged two-dimensionally along a surface of the substrate within the substrate and cause the surface of the substrate to be reached at each modified region by at least one of: (i) a modified region itself reaching the surface, or (ii) a fracture that originates from the modified region reaching the surface;
   in the first step, the substrate is irradiated with the laser light a plurality of times while changing the distance between the surface of the substrate and a converging point of the laser light so as to form, in an area corresponding to a depression, a plurality of the modified regions aligned along a thickness direction of the substrate; and
   a second step of etching the surface of the substrate after the first step so as to form depressions and projections on the surface of the substrate; and
   a third step of transferring a form of the surface of the substrate after the second step so as to yield the mold,
   wherein the depressions are each independently formed by etching progressing from the modified region or the fracture as a start point, and
   wherein the plurality of modified regions are formed in matrix form.

9. A method for manufacturing a mold for making a light-absorbing substrate according to claim 8, wherein the modified regions are arranged in a two-dimensional matrix.

10. A method for manufacturing a mold for making a light-absorbing substrate according to claim 9, wherein each center position of the plurality of depressions match the formation position of the modified regions that are arranged in a two-dimensional matrix.

11. A method for manufacturing a mold for making a light-absorbing substrate according to claim 8, wherein the depressions formed by etching expand outward.

* * * * *